(12) United States Patent
Cai et al.

(10) Patent No.: US 8,766,410 B2
(45) Date of Patent: Jul. 1, 2014

(54) EMBEDDED DRAM INTEGRATED CIRCUITS WITH EXTREMELY THIN SILICON-ON-INSULATOR PASS TRANSISTORS

(75) Inventors: Jin Cai, Cortlandt Manor, NY (US); Josephine Chang, Mahopac, NY (US); Leland Chang, New York, NY (US); Brian L. Ji, Fishkill, NY (US); Steven John Koester, Ossining, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/153,806

(22) Filed: Jun. 6, 2011

(65) Prior Publication Data

US 2011/0233634 A1    Sep. 29, 2011

Related U.S. Application Data

(62) Division of application No. 11/929,943, filed on Oct. 30, 2007, now Pat. No. 7,985,633.

(51) Int. Cl.
*H01L 23/58* (2006.01)

(52) U.S. Cl.
USPC .... 257/638; 257/348; 257/350; 257/E27.112; 438/171; 438/190; 438/210; 438/239; 438/243; 438/244; 438/245

(58) Field of Classification Search
USPC .......... 257/638, 350, E27.112, 348; 438/171, 438/190, 210, 239, 243, 244, 245
See application file for complete search history.

(56) References Cited

U.S. PATENT DOCUMENTS

| | | | |
|---|---|---|---|
| 5,212,397 A | 5/1993 | See et al. | |
| 5,858,831 A | 1/1999 | Sung | |
| 6,063,652 A | 5/2000 | Kim | |
| 6,133,130 A | 10/2000 | Lin et al. | |
| 6,214,676 B1 | 4/2001 | Jun et al. | |
| 6,472,265 B1 | 10/2002 | Hsieh | |
| 6,509,218 B2 * | 1/2003 | Yeh et al. | 438/154 |
| 6,537,891 B1 * | 3/2003 | Dennison et al. | 438/406 |
| 6,818,496 B2 | 11/2004 | Dennison et al. | |

(Continued)

OTHER PUBLICATIONS

R. W. Keyes, "Effect of Randomness in the Distribution of Impurity Ions on FET Thresholds in Integrated Electronics," IEEE Journal of Solid-State Circuits, vol. SC-10, pp. 245-247, Aug. 1975.

(Continued)

*Primary Examiner* — Kimberly Rizkallah
*Assistant Examiner* — Maria Ligai
(74) *Attorney, Agent, or Firm* — Vazken Alexanian; Michael J. Chang, LLC

(57) ABSTRACT

Integrated circuits having combined memory and logic functions are provided. In one aspect, an integrated circuit is provided. The integrated circuit comprises: a substrate comprising a silicon layer over a BOX layer, wherein a select region of the silicon layer has a thickness of between about three nanometers and about 20 nanometers; at least one eDRAM cell comprising: at least one pass transistor having a pass transistor source region, a pass transistor drain region and a pass transistor channel region formed in the select region of the silicon layer; and a capacitor electrically connected to the pass transistor.

16 Claims, 7 Drawing Sheets

(56) References Cited

U.S. PATENT DOCUMENTS

| | | |
|---|---|---|
| 7,195,972 B2 | 3/2007 | Chidambarrao et al. |
| 2002/0011622 A1* | 1/2002 | Keshavarzi et al. .......... 257/314 |
| 2002/0100945 A1* | 8/2002 | Mandelman et al. ......... 257/401 |
| 2002/0182801 A1 | 12/2002 | Shimazaki et al. |
| 2006/0216898 A1* | 9/2006 | Tigelaar ....................... 438/295 |
| 2006/0231899 A1* | 10/2006 | Chang et al. ................. 257/368 |

OTHER PUBLICATIONS

R. Katsumata et al., "Fin-Array-FET on bulk silicon for sub-100 nm Trench Capacitor DRAM," Symposium on VLSI Technology, Jun. 2003.

M. Yoshida et al., "A Full FinFET DRAM Core Integration Technology Using a Simple Selective Fin Formation Technique," Symposium on VLSI Technology, Oct. 2006.

H. Kawasaki et al., "Embedded Bulk FinFET SRAM Cell Technology with Planar FET Peripheral Circuit for hp32 nm node and beyond," Symposium on VLSI Technology, Oct. 2006.

G. Wang et al., "A 0.127 µm2 High Performance 65nm SOI Based embedded DRAM for on-Processor Applications," International Electron Devices Meeting, Dec. 2006.

\* cited by examiner

100

300

200

EMBEDDED DRAM INTEGRATED CIRCUITS WITH EXTREMELY THIN SILICON-ON-INSULATOR PASS TRANSISTORS

CROSS-REFERENCE TO RELATED APPLICATIONS

This application is a divisional of U.S. application Ser. No. 11/929,943 filed on Oct. 30, 2007, the contents of which are incorporated herein by reference.

FIELD OF THE INVENTION

The present invention relates to integrated circuits with embedded dynamic random access memory (eDRAM), and more particularly, to techniques for improving eDRAM performance.

BACKGROUND OF THE INVENTION

It is a common practice to integrate memory and logic functions on a common semiconductor substrate. In such a configuration, when the memory function is performed by a dynamic random access memory (DRAM) cell, the circuitry is referred to as embedded DRAM (eDRAM).

The use of eDRAM as microprocessor cache, however, involves making tradeoffs between performance parameters, such as speed, retention time and power consumption, and production parameters, such as yield and design complexity. Due to their small sizes, memory cells are especially susceptible to process-induced variations, which worsen these tradeoffs and compromise memory cell functionality. Thus, steps need to be taken to minimize process-induced variations.

For example, reducing variability in the pass transistor of an eDRAM cell can simultaneously improve all memory cell performance parameters. Typically, an eDRAM cell calls for a bulk-silicon pass transistor with a heavily doped channel which, in addition to being sensitive to process non-uniformities, is inherently vulnerable to variability from random dopant fluctuations. See, R. W. Keyes, "Effect of Randomness in the Distribution of Impurity Ions on FET Thresholds in Integrated Electronics," IEEE Journal of Solid-State Circuits, vol. SC-10, pp. 245-247, August 1975. While solutions for addressing variability problems in microprocessor memories exist to better control device characteristics (e.g., better process control during manufacturing and careful cell layout), random dopant fluctuations present a fundamental limitation to improving eDRAM performance.

The use of undoped channel devices such as fin-field effect transistors (FinFETs) for memory (both static random access memory (SRAM) and DRAM) has been proposed for this reason. See, R. Katsumata et al., "Fin-Array-FET on bulk silicon for sub-100 nm Trench Capacitor DRAM," Symposium on VLSI Technology, 2003; M. Yoshida et al., "A Full FinFET DRAM Core Integration Technology Using a Simple Selective Fin Formation Technique," Symposium on VLSI Technology, 2006; and H. Kawasaki et al., "Embedded Bulk FinFET SRAM Cell Technology with Planar FET Peripheral Circuit for hp32 nm node and beyond," Symposium on VLSI Technology, 2006. However, the integration of FinFETs with planar logic is difficult due to vertical topography, especially since DRAM processes generally rely on bulk silicon wafer substrates. In addition, an entirely FinFET-based technology (both memory and logic) has yet to be implemented in the industry. Thus, the use of FinFETs for eDRAM is not yet practical. Currently, the standard approach in modern memory technologies has been to use larger devices for memory than for logic at the expense of layout density.

As such, techniques that eliminate variability due to random dopant fluctuations in eDRAM would be desirable.

SUMMARY OF THE INVENTION

The present invention provides integrated circuits having combined memory and logic functions. In one aspect of the invention, an integrated circuit is provided. The integrated circuit comprises: a substrate comprising a silicon layer over a BOX layer, wherein a select region of the silicon layer has a thickness of between about three nanometers and about 20 nanometers; at least one eDRAM cell comprising: at least one pass transistor having a pass transistor source region, a pass transistor drain region and a pass transistor channel region formed in the select region of the silicon layer; and a capacitor electrically connected to the pass transistor.

In another aspect of the invention, a method of fabricating an integrated circuit is provided. The method comprises the following steps. A substrate is provided. A PDSOI region and an ETSOI region are formed in the substrate. A trench capacitor is formed in the substrate in the ETSOI region. A logic transistor gate stack is formed over the substrate in the PDSOI region and a pass transistor gate stack is formed over the substrate in the ETSOI region, wherein a region below the logic transistor gate stack comprises a logic transistor channel region and a region below the pass transistor gate stack comprises a pass transistor channel region. A logic transistor source region and a logic transistor gate region are formed in the substrate in the PDSOI region, and a pass transistor source region and a pass transistor gate region are formed in the substrate in the ETSOI region.

A more complete understanding of the present invention, as well as further features and advantages of the present invention, will be obtained by reference to the following detailed description and drawings.

DETAILED DESCRIPTION OF PREFERRED EMBODIMENTS

Figure 1:
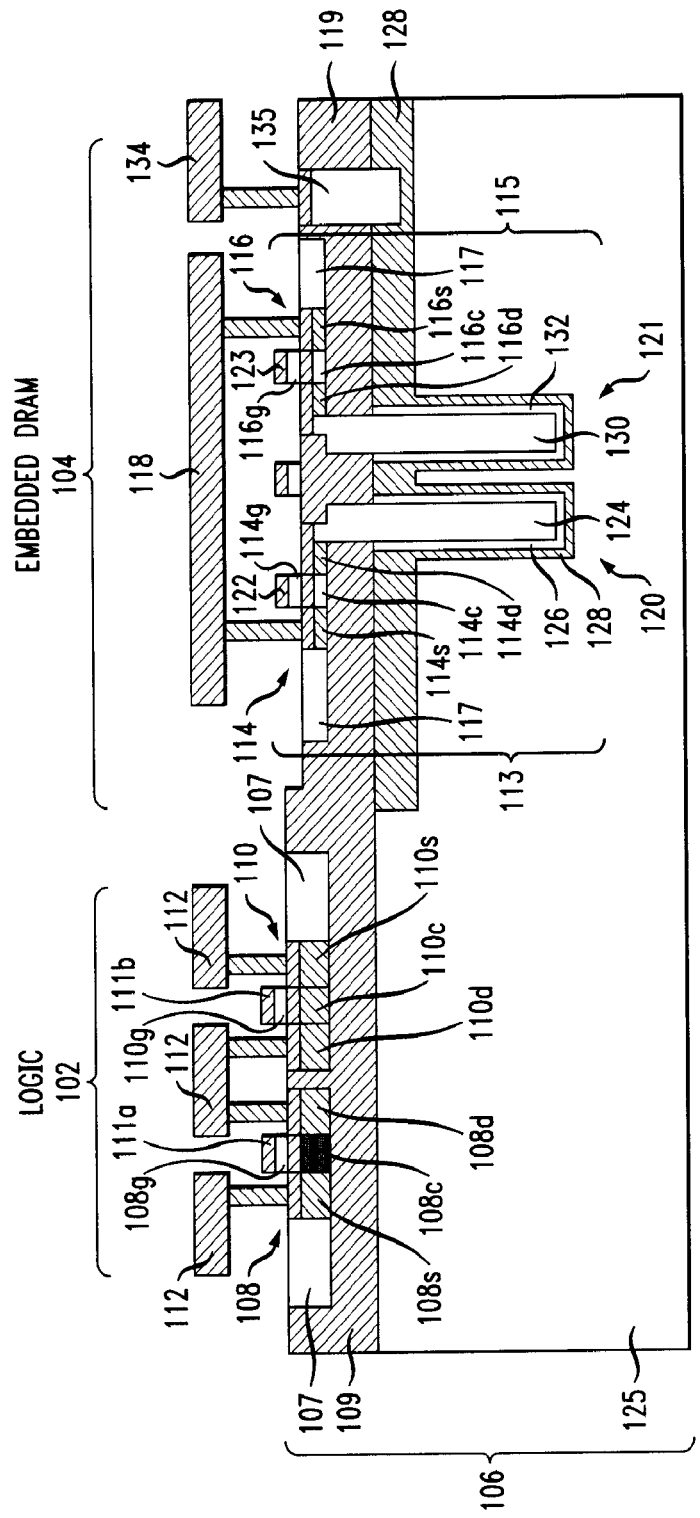
FIG. 1 is a cross-sectional diagram illustrating an exemplary integrated circuit having both a logic region and an embedded dynamic random access memory (eDRAM) region according to an embodiment of the present invention.

FIG. 1 is a cross-sectional diagram illustrating exemplary integrated circuit 100 having both a logic region 102 and an embedded dynamic random access memory (eDRAM) region 104. Namely, logic region 102 comprises logic transistors 108 and 110, and eDRAM region 104 comprises eDRAM cells 113 and 115 (having pass transistors 114 and 116, and trench capacitors 120 and 121, respectively), wherein the logic transistors and eDRAM cells are integrated on a common substrate 106.

Substrate 106 comprises a silicon-on-insulator (SOI) substrate having at least two distinct regions therein, one region corresponding to logic region 102 and one region corresponding to eDRAM region 104. The region of substrate 106 corresponding to logic region 102 comprises a partially depleted SOI (PDSOI) region having a silicon (Si) layer 107 over a buried oxide (BOX) layer 109, wherein Si layer 107 has a thickness of between about 30 nanometers (nm) and about 100 nm and forms source, drain and channel regions of logic transistors 108 and 110. The region of substrate 106 corresponding to eDRAM region 104 comprises an extremely-thin SOI (ETSOI) region having a Si layer 117 over a BOX layer 119, wherein Si layer 117 has a thickness of between about three nm and about 20 nm and forms source, drain and channel regions of the pass transistors (described below) of eDRAM cells 113 and 115. Substrate 106 further comprises Si layer 125, i.e., a p-type semiconductor layer, below the BOX layers. As will be described below, a heavily doped Si area 128 can be present in the eDRAM region separating the trench capacitors from substrate 106. The formation of logic transistors on a PDSOI region of a substrate and the formation of eDRAM cells on an ETSOI region of a substrate is described in detail below.

As shown in FIG. 1, logic transistors 108 and 110 comprise standard logic transistors. Each logic transistor has a source region and a drain region connected by a channel region. By way of reference to FIG. 1, logic transistor 108 has source region 108s connected to drain region 108d by channel region 108c, and gate region 108g over channel region 108c. Similarly, logic transistor 110 has source region 110s connected to drain region 110d by channel region 110c, and gate region 110g over channel region 110c. Contact 111a is provided to gate region 108g and contact 111b is provided to gate region 110g. Contacts 112 are provided to the source regions, i.e., 108s/110s, and drain regions, i.e., 108d/110d.

The channel region in each of logic transistors 108 and 110, i.e., channel region 108c and channel region 110c, respectively, is doped. The particular dopant(s), e.g., either n-well or p-well dopants, used in the channel region will depend on the intended functionality of each logic transistor.

As shown in FIG. 1, eDRAM cells 113 and 115 each comprise a pass transistor connected to a trench capacitor. Namely, eDRAM cell 113 comprises pass transistor 114 electrically connected to trench capacitor 120, and eDRAM cell 115 comprises pass transistor 116 electrically connected to trench capacitor 121.

According to an exemplary embodiment, each of pass transistors 114 and 116 comprises an n-channel metal-oxide semiconductor field effect transistor (NMOSFET) (hereinafter abbreviated as "NFET"). Namely, pass transistor 114 has source region 114s connected to drain region 114d by channel region 114c, and gate region 114g over channel region 114c. Similarly, pass transistor 116 has source region 116s connected to drain region 116d by channel region 116c, and gate region 116g over channel region 116c.

The channel regions in pass transistors 114 and 116 are not doped. By using undoped pass transistors, variability in performance due to random dopant fluctuations is eliminated all together, which markedly improves retention time, performance and continued density scaling, as compared to conventional devices. Further, since the channel regions of pass transistors 114 and 116 are formed in an ETSOI region of substrate 106, a threshold voltage $V_t$ of each pass transistor is set by the gate work function, rather than by channel doping as in conventional devices. Namely, since the channel regions have a thickness based upon a thickness of silicon layer 117 in the ETSOI region, i.e., between about three nm and about 20 nm, the $V_t$ is not affected by channel region properties.

Trench capacitor 120 comprises polysilicon (poly-Si) conductor 124 separated from substrate 106 by dielectric 126. Similarly, trench capacitor 121 comprises poly-Si conductor 130 separated from substrate 106 by dielectric 132. An area 128 of substrate 106 surrounding trench capacitors 120 and 121 may comprise heavily doped Si and serve as ground to the capacitors.

Figure 5:
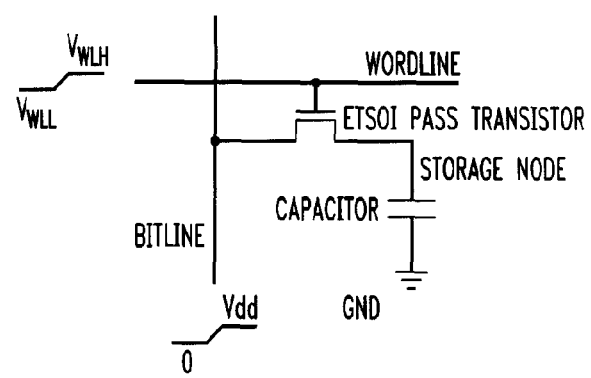
FIG. 5 is a circuit diagram of an eDRAM cell according to an embodiment of the present invention.

Contact 118 is provided to source regions 114s and 116s. According to an exemplary embodiment, contact 118 serves as a bit line of the eDRAM cells. Contacts 122 and 123 are provided to gate regions 114g and 116g, respectively. According to an exemplary embodiment, contacts 122 and 123 serve as word lines of the eDRAM cells. Contact 134 is provided, by way of poly-Si via 135, to the heavily doped Si area 128 (i.e., ground). A circuit diagram of an exemplary eDRAM cell is shown in FIG. 5 (described below).

Figure 2:
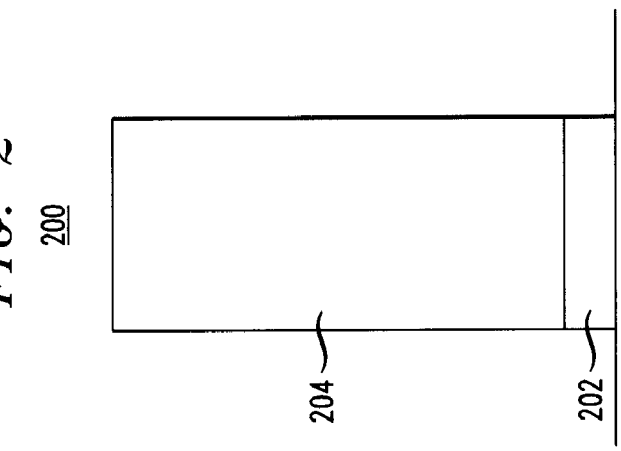
FIG. 2 is a cross-sectional diagram illustrating an exemplary silicon gate stack according to an embodiment of the present invention.

The gate regions of the logic transistors and the pass transistors can have a number of different configurations. For example, the gate regions of the logic transistors and the pass transistors can comprise Si gate stacks. FIG. 2 is a cross-sectional diagram illustrating exemplary Si gate stack 200. Si gate stack 200 can be used to form the gate regions of any one of the logic transistors and pass transistors described, for example, in conjunction with the description of FIG. 1, above. Gate stack 200 comprises gate dielectric layer 202, i.e., over a channel region, and Si layer 204 over gate dielectric layer 202. Gate dielectric layer 202 can comprise any suitable Si gate dielectric material, including, but not limited to, a nitride and an oxynitride. Si layer 204 can comprise one or more of poly-Si and amorphous Si.

Si layer 204 is doped. Si layer 204 can be doped with either an n-type dopant or a p-type dopant depending on the desired $V_t$. By way of example only, the work function of an n-doped poly-Si gate stack yields a $V_t$ of about −0.2 volts (V), whereas the work function of a p-doped poly-Si gate stack yields a $V_t$ of about 0.8V. The word line swing will have to accommodate a $V_t$ of between about −0.5V and about 1V. Suitable n-type dopants include, but are not limited to, phosphorous (P), arsenic (As) and antimony (Sb). Suitable p-type dopants include, but are not limited to, boron (B) and borondifluoride ($BF_2$). Alternatively, Si layer 204 can be doped with a p-type dopant and slightly counter-doped with an n-type doping. The counter-doping serves to reduce the $V_t$. Therefore, the amount of counter-doping can vary depending on how much the $V_t$ needs to shift. In general, the doping concentration depends on the gate work function (which determines how much $V_t$ needs to shift), as well as on the Si layer thickness ($T_{si}$) (which determines the number of dopant atoms). By way of example only, for p-doped poly-Si having a thickness $T_{si}$, of eight nm, the counter-doping should be about $2 \times 10^{18}$ cm-3.

Figure 3:
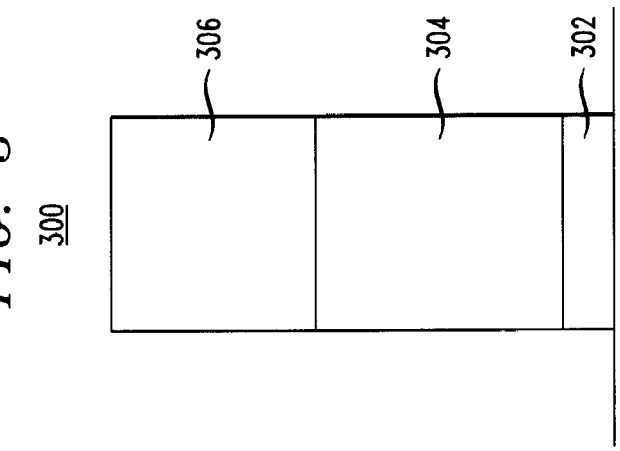
FIG. 3 is a cross-sectional diagram illustrating an exemplary metal gate stack according to an embodiment of the present invention.

The gate regions of the logic transistors and the pass transistors may instead comprise metal gate stacks. FIG. 3 is a cross-sectional diagram illustrating exemplary metal gate stack 300. Metal gate stack 300 can be used to form the gate regions of any one of the logic transistors and pass transistors described, for example, in conjunction with the description of FIG. 1, above. The term "metal gate stack," as used herein, refers to the presence of a metal gate layer in the gate stack. Namely, gate stack 300 comprises metal-gated dielectric layer 302, i.e., over a channel region, metal gate layer 304 over metal-gated dielectric layer 302 and Si layer 306 over a side of metal gate layer 304 opposite metal-gated dielectric layer 302. Metal-gated dielectric layer 302 can comprise a high-K material. Suitable high-K materials include, but are not limited to, one or more of tantalum oxide ($Ta_2O_5$), hafnium oxide ($HfO_2$), aluminum oxide ($Al_2O_3$), titanium oxide ($TiO_2$) and lanthanum oxide ($La_2O_5$). Metal gate layer 304 can comprise one or more of tantalum (Ta), tantalum carbide nitride (TaCN), tantalum nitride (TaN), tantalum silicon nitride (TaSiN), aluminum nitride (AlN), tantalum silicide (TaSi), tungsten (W) and molybdenum (Mo). Si layer 306 can comprise one or more of poly-Si and amorphous Si. Si layer 306 can be doped with either an n-type or a p-type dopant depending on the desired $V_t$. Suitable n-type and p-type dopants were described above. According to an exemplary embodiment, when the gate regions of the pass transistors comprise metal gate stacks, each pass transistor has a gate work function of between about 150 millivolts (mV) and about 300 mV towards midgap away from the valence bandedge. It is notable that not all metal gate stack configurations that may be used herein employ a Si layer. For example, fully-silicided (FUSI) gate stacks do not need a Si layer.

Figure 4:
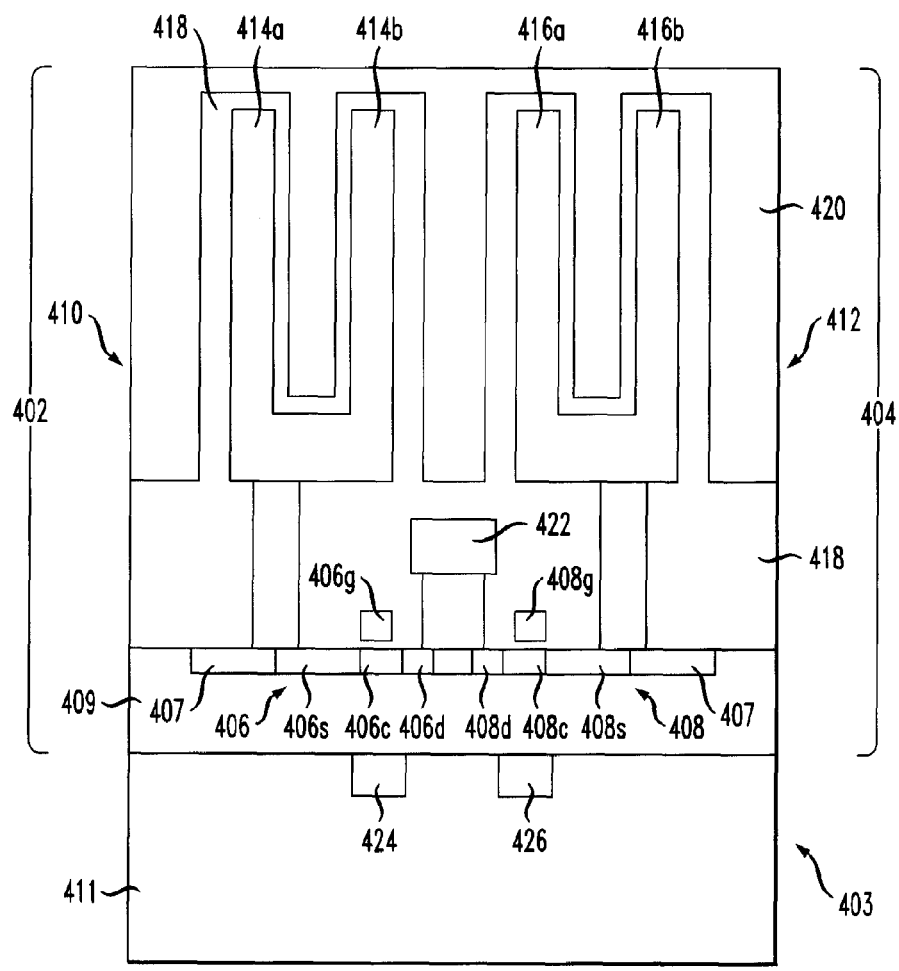
FIG. 4 is a cross-sectional diagram illustrating exemplary eDRAM cells having stacked capacitors according to an embodiment of the present invention.

Instead of having a trench capacitor, the eDRAM cells can each have a stacked capacitor that is above the substrate. FIG. 4 is a cross-sectional diagram illustrating exemplary eDRAM cells 402 and 404 having pass transistors 406 and 408, and stacked capacitors 410 and 412, respectively. Exemplary eDRAM cells 402 and 404 can be used in place of one or more of eDRAM cells 113 and 115 in integrated circuit 100, described, for example, in conjunction with the description of FIG. 1, above. Exemplary eDRAM cell 402 comprises pass transistor 406, i.e., an NFET, electrically connected to stacked capacitor 410, and exemplary eDRAM cell 404 comprises pass transistor 408, i.e., an NFET, electrically connected to stacked capacitor 412. Pass transistors 406 and 408 are formed in substrate 403.

Substrate 403, as shown, represents one region of a larger SOI substrate (which can also include at least one logic region (not shown)) corresponding to an eDRAM region of an integrated circuit. Namely, the region represented by substrate 403 comprises an ETSOI region having a Si layer 407 over a BOX layer 409, wherein Si layer 407 has a thickness of between about three nm and about 20 nm and forms source, drain and channel regions of pass transistors 406 and 408. Substrate 403 further comprises Si layer 411, i.e., a p-type semiconductor layer, below BOX layer 409.

Pass transistor 406 has source region 406s connected to drain region 406d by channel region 406c and gate region 406g over channel region 406c. Pass transistor 408 has source region 408s connected to drain region 408d by channel region 408c and gate region 408g over channel region 408c.

As above, the channel regions of the pass transistors are not doped. Further, since the channel regions of pass transistors 406 and 408 are formed in an ETSOI region, a threshold voltage $V_t$ of each pass transistor is set by the gate work function, rather than by channel doping as in conventional devices. Namely, since the channel regions have a thickness based upon a thickness of Si layer 407 in the ETSOI region, i.e., between about three nm and about 20 nm, the $V_t$ is not affected by channel region properties.

Stacked capacitor 410 comprises poly-Si conductors 414a and 414b, and stacked capacitor 412 comprises poly-Si conductors 416a and 416b. A continuous dielectric layer 418 is present around stacked capacitors 410 and 412 (as well as surrounding the gate region of each pass transistor) and separates stacked capacitors 410 and 412 from heavily doped Si layer 420. In this configuration, heavily doped Si layer 420 serves as ground for the stacked capacitors.

Contact 422 is provided to drain regions 406d and 408d. According to an exemplary embodiment, contact 422 serves as a bit line of the eDRAM cells. Gate regions 406g and 408g serve as word lines of the eDRAM cells.

Pass transistors 406 and 408 can optionally be back-gated. Namely, back gate electrodes 424 and 426 may be present below pass transistors 406 and 408, respectively, and can serve to adjust the $V_t$ of the corresponding pass transistor.

FIG. 5 is a circuit diagram of one of the eDRAM cells described above (i.e., eDRAM cell 113 or 115 of FIG. 1, or eDRAM cell 402 or 404 of FIG. 4). The word line (WL) voltages are configured so as to accommodate the $V_t$ of the ETSOI-based pass transistor. Ideally, the pass transistor would have a $V_t$ high enough so that the low value of the word-line voltage VWLL could be kept at zero, while still maintaining acceptable leakage. However, if the $V_t$ of the pass transistor is low, a negative value of VWLL could be utilized. Similarly, if the $V_t$ of the pass transistor is high, a VWLL could take on a positive value. The high value of the word-line voltage VWLH level is determined by the performance requirements of the pass transistor.

When the drain voltage ($V_{dd}$) is zero and the WL is high, the capacitor is discharged and a "0" is written into the eDRAM cell. When the Vdd and the WL are low, the capacitor is charged and a "1" is written into the eDRAM cell.

Figure 6A:
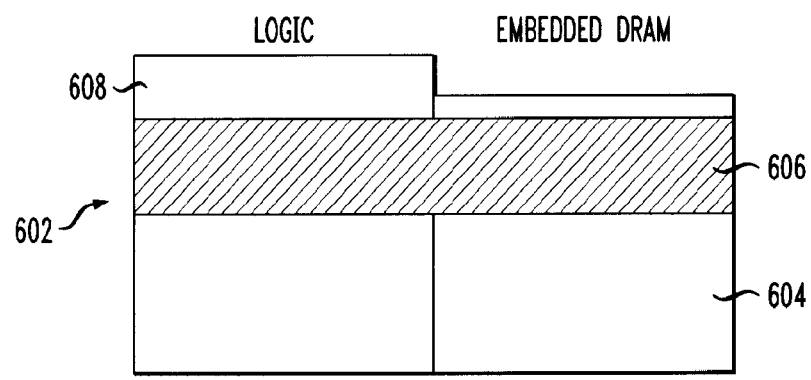
FIGS. 6A-I are cross-sectional diagrams illustrating an exemplary methodology for fabricating an integrated circuit having both a logic region and an eDRAM region integrated on a common substrate according to an embodiment of the present invention.
Figure 6B:
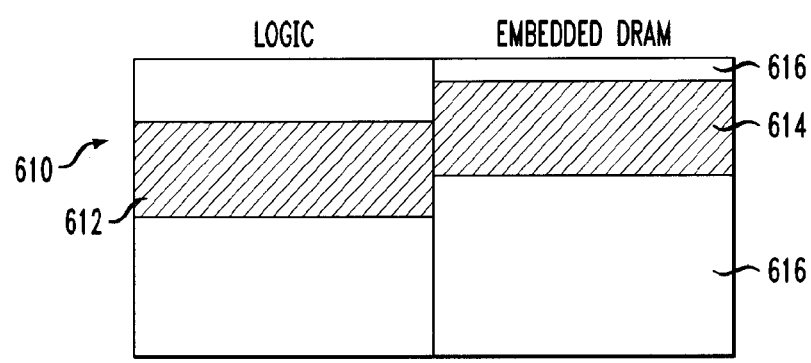

FIGS. 6A-I are cross-sectional diagrams illustrating an exemplary methodology for fabricating an integrated circuit having both a logic region and an eDRAM region integrated on a common substrate. Namely, as shown in FIG. 6A and FIG. 6B a substrate is provided. Two distinct regions are then formed in the substrate, one region, a PDSOI region, corresponding to the logic region and the other region, an ETSOI region, corresponding to the eDRAM region. In FIGS. 6A-I, the logic region is shown as being formed on a left side of the substrate and the eDRAM region is shown as being formed on a right side of the substrate. This configuration is merely exemplary, and the integrated circuit layout can be different from what is shown. The region of the substrate corresponding to the logic region comprises a PDSOI region which serves as the starting platform for forming a logic transistor, and the region of the substrate corresponding to the eDRAM region comprises an ETSOI region which serves as the starting platform for forming a pass transistor of an eDRAM cell.

Forming a PDSOI region and an ETSOI region in a substrate can be done in a number of different ways. One way is shown illustrated in FIG. 6A wherein the substrate provided is an SOI substrate having a first semiconductor layer 604, a BOX layer 606 over the first semiconductor layer and a second semiconductor layer 608 over a side of BOX layer 606 opposite first semiconductor layer 604. Preferably, both the first and the second semiconductor layers comprise Si, and the BOX layer comprises silicon dioxide ($SiO_2$).

Second semiconductor layer 608 is thicker in the PDSOI logic region than in the ETSOI eDRAM region. Namely, a thickness of second semiconductor layer 608 in the PDSOI logic region is between about 30 nm and about 100 nm, and a thickness of second semiconductor layer 608 in the ETSOI eDRAM region is between about three nm and about 20 nm. This variable thickness can be accomplished in a number of ways. One way is to provide the second semiconductor layer having a desired thickness for the PDSOI logic region and then using localized thinning of the second semiconductor layer in the ETSOI eDRAM region, e.g., using oxidation, to achieve a desired thickness in the ETSOI eDRAM region. Another way is to provide the second semiconductor layer having a thickness that is greater than the desired thickness in the ETSOI eDRAM region, thin the second semiconductor layer in both the PDSOI logic and the ETSOI eDRAM regions to the desired thickness for the ETSOI eDRAM region and then use Si epitaxy to regrow the second semiconductor layer in the PDSOI logic region to the desired thickness in the PDSOI logic region. Substrate 602 can be formed by either method.

Another way to form a PDSOI region and an ETSOI region in a substrate is shown illustrated in FIG. 6B wherein the substrate provided is a bulk Si substrate 616. A dual-energy oxygen implant is then performed into the bulk Si substrate to create a first BOX layer 612 in the PDSOI logic region and a second BOX layer 614 in the ETSOI eDRAM region, wherein the first and second BOX layers are at different depths from one another in the bulk Si substrate. Substrate 610 can be formed by this method.

Figure 6C:
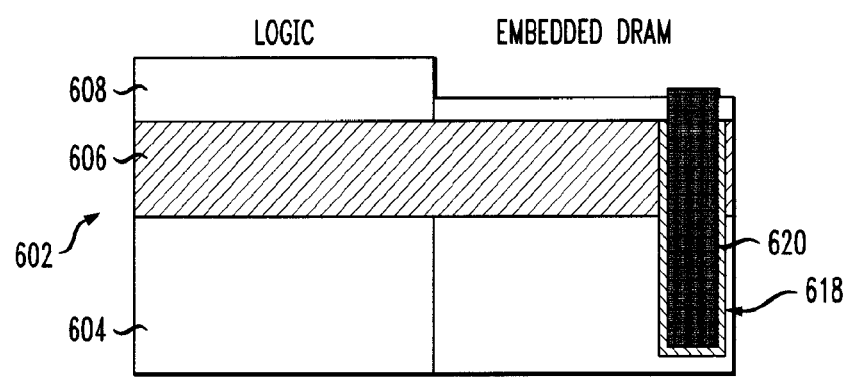

While any of the techniques illustrated in FIGS. 6A and 6B are equally suitable for forming the substrate for the integrated circuit, for illustrative purposes only, a substrate formed according to the techniques illustrated in FIG. 6A is used in the following description of the fabrication process. As shown in FIG. 6C, a trench is formed in the ETSOI eDRAM region that extends through second semiconductor layer 608, BOX layer 606 and a portion of first semiconductor layer 604. According to an exemplary embodiment, the trench is formed to a depth of between about three micrometers (μm) and about five μm.

A dielectric layer 618 is then formed in the trench. Dielectric layer 618 can be formed either by deposition or by selective growth techniques. Suitable deposition techniques include, but are not limited to, chemical vapor deposition (CVD) and atomic layer deposition (ALD), and suitable selective growth techniques include, but are not limited to, standard oxidation techniques, such as thermal oxidation. With either method, dielectric layer 618 is formed having a thickness of between about three nm and about five nm. Remaining space within the trench is then filled with poly-Si, forming poly-Si conductor 620. Dielectric layer 618 is then recessed down to BOX layer 606 so as to permit poly-Si conductor 620 to make contact with second semiconductor layer 608. As such a trench capacitor is formed.

Figure 6D:
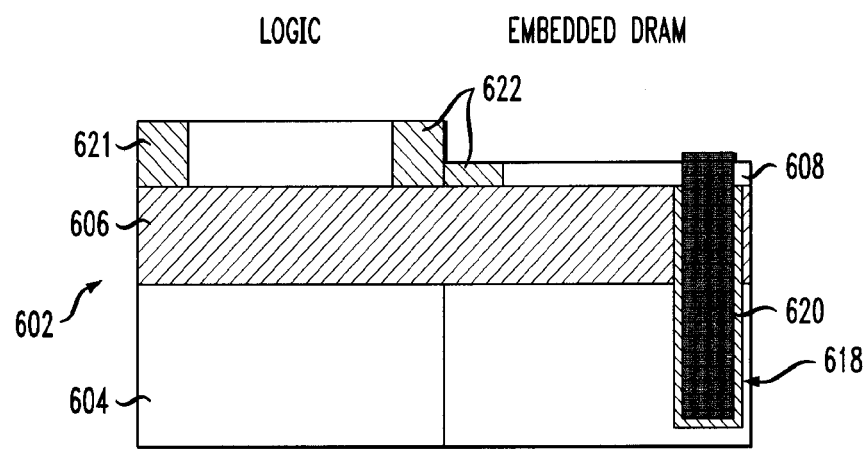
Figure 6E:
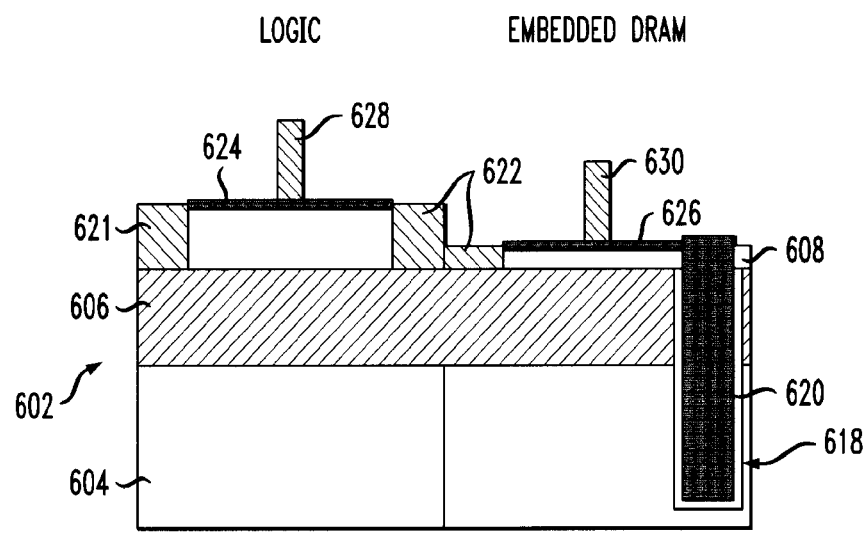

As shown in FIG. 6D, shallow trench isolation (STI) regions 621 and 622 are formed which will isolate the PDSOI logic and the ETSOI eDRAM regions. As shown in FIG. 6E, a well implant(s) (not shown) is performed in the PDSOI logic region of second semiconductor layer 608 (i.e., into a channel region (see below)), and gate dielectric layers 624 and 626 are grown over second semiconductor layer 608 in the PDSOI logic region and in the ETSOI eDRAM region, respectively. Gate dielectric layers 624 and 626 can comprise a nitride/oxynitride or a high-K material (as described above). A suitable gate material(s) is then deposited over the PDSOI logic and the ETSOI eDRAM regions, and then patterned to form gate stacks 628 and 630 over channel regions of the respective logic transistor and pass transistor, respectively. The material for forming gate stack 628 may be the same as, or different from, the material used to form gate stack 630. By way of example only, poly-Si and/or amorphous Si (as described above) may be used to form both gate stacks 628 and 630. Alternatively, poly-Si and/or amorphous Si may be used to form gate stack 628, while a combination of a metal gate material with poly-Si and/or amorphous Si may be used to form gate stack 630 (as described above).

Figure 6F:
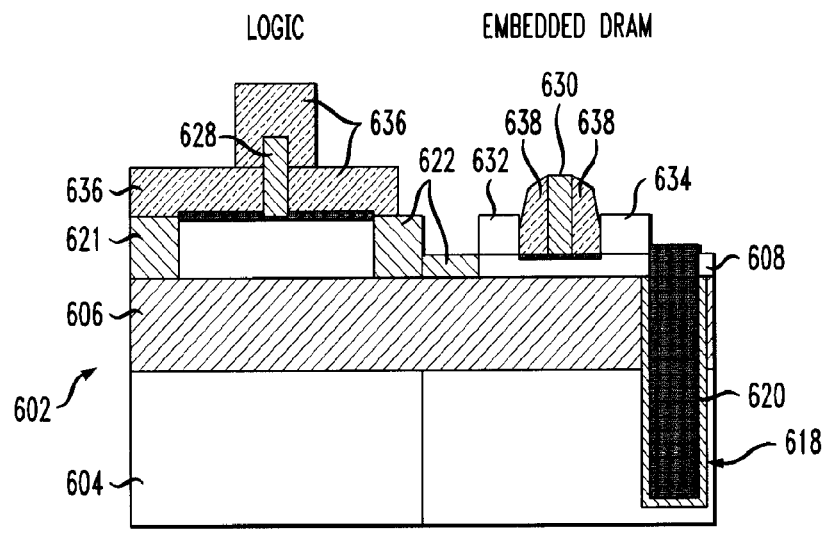

As shown in FIG. 6F, raised source/drain regions 632 and 634 are formed in the ETSOI eDRAM region. Namely, a nitride layer is deposited over both the PDSOI logic and the ETSOI eDRAM regions, to a thickness of between about 20 nm and about 40 nm, covering both gate stacks 628 and 630. A mask (not shown) is placed over the nitride layer in the PDSOI logic region, to protect the nitride layer in the PDSOI logic region during the following etching step. Namely, nitride-selective reactive ion etching (RIE) is used to etch the nitride layer in the ETSOI eDRAM region to form nitride disposable spacers 638 adjacent to gate stack 630. Following the etching, the mask is removed and portions 636 of the nitride layer remain over the PDSOI logic region. Si epitaxy is then used to grow raised source/drain regions 632 and 634 in the ETSOI eDRAM region on opposite sides of gate stack 630.

Figure 6G:
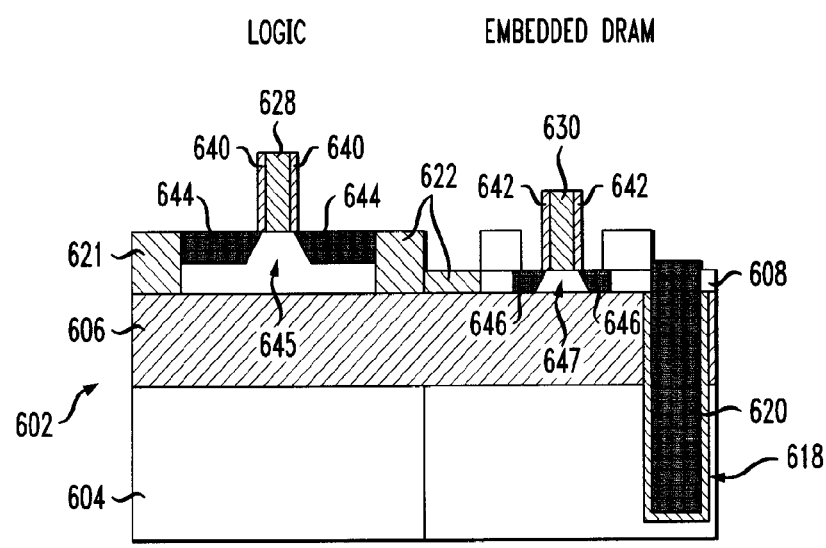

As shown in FIG. 6G, portions 636 of the nitride layer and nitride disposable spacers 638 (see FIG. 6F, described above) are removed. Oxide spacers 640 and 642 are then formed adjacent to opposite sides of gate stacks 628 and 630, respectively. According to an exemplary embodiment, oxide spacers 640 and 642 are formed having a thickness of between about three nm and about 15 nm. Following formation of the oxide spacers, extension implants 644 and 646 are then performed into second semiconductor layer 608 in the PDSOI logic and ETSOI eDRAM regions, respectively. Extension implants 644 and 646 serve to define channel regions 645 and 647, i.e., below gate stacks 628 and 630, respectively.

Figure 6H:
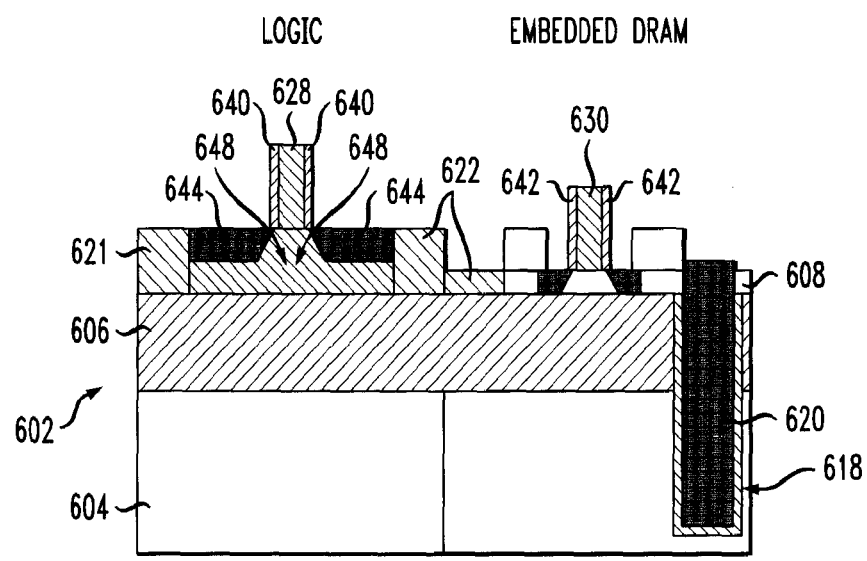
Figure 6I:
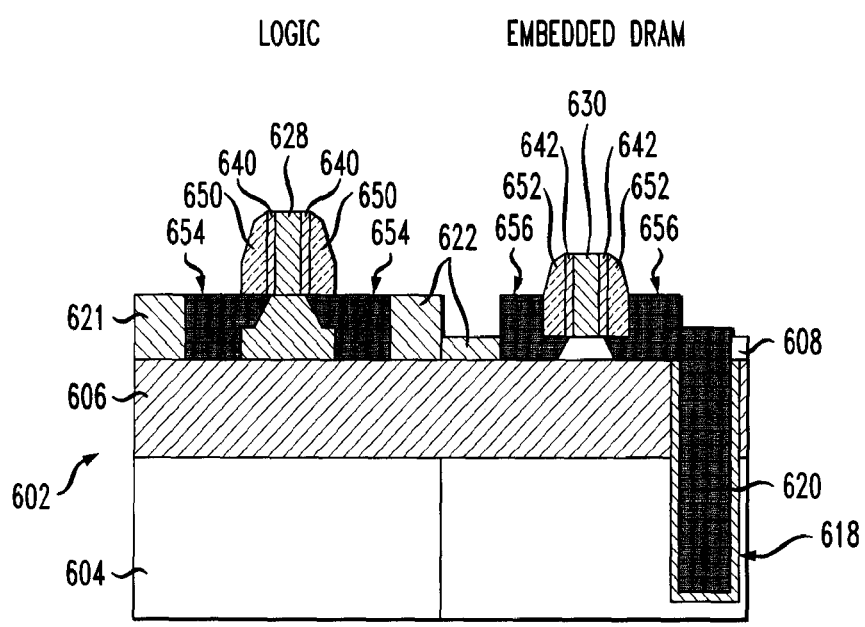

As shown in FIG. 6H, angled halo implants 648 are then performed into second semiconductor layer 608 in the PDSOI logic region. As shown in FIG. 6I, nitride spacers 650 and 652 are formed in the PDSOI logic and ETSOI eDRAM regions adjacent to oxide spacers 640 and 642, respectively. According to an exemplary embodiment, nitride spacers 650 and 652 are formed having a thickness of between about 20 nm and about 50 nm. Deep source/drain implants 654 and 656 are then performed to form source and drain regions in both the PDSOI logic and the ETSOI eDRAM regions, respectively. The deep source/drain implants for the PDSOI logic region may, or may not, be the same as the deep source/drain implants for the ETSOI eDRAM region, and may vary depending on the geometries of the structures.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An integrated circuit comprising:
   a substrate comprising a silicon layer over a buried oxide (BOX) layer, wherein a select region of the silicon layer, an extremely-thin silicon-on-insulator (ETSOI) region, has a thickness of between about three nanometers and about 20 nanometers;
   at least one embedded dynamic random access memory (eDRAM) cell comprising:
      at least one pass transistor having a pass transistor source region, a pass transistor drain region and a pass transistor channel region formed in the select region of the silicon layer and a pass transistor gate region over the pass transistor channel region, wherein the pass transistor channel region is undoped and is defined by extension implants in the silicon layer at opposite ends of the pass transistor channel region, and wherein a threshold voltage of the pass transistor is set by a work function of the pass transistor gate region as opposed to the channel region which is undoped;
      a capacitor electrically connected to the pass transistor; and a doped silicon layer surrounding the capacitor configured to serve as a ground to the capacitor.

2. The integrated circuit of claim 1, wherein an other select region of the silicon layer, a partially depleted silicon-on-insulator (PDSOI) region, has a thickness of between about 30 nanometers and about 100 nanometers, and the integrated circuit further comprises:
  at least one logic transistor having a logic transistor source region, a logic transistor drain region and a logic transistor channel region formed in the other select region of the silicon layer.

3. The integrated circuit of claim 2, wherein the logic transistor further comprises:
  a logic transistor gate region over the logic transistor channel region.

4. The integrated circuit of claim 3, wherein the logic transistor gate region comprises a gate stack having a gate dielectric layer and a silicon layer over the gate dielectric layer.

5. The integrated circuit of claim 4, wherein the silicon layer comprises one or more of polysilicon and amorphous silicon.

6. The integrated circuit of claim 3, wherein the logic transistor gate region comprises a gate stack having a metal-gated dielectric layer and a metal gate layer over the metal-gated dielectric layer.

7. The integrated circuit of claim 3, wherein the logic transistor gate region comprises a gate stack having a gate dielectric layer and a silicon layer over the gate dielectric layer, and wherein the pass transistor gate region comprises a gate stack having a metal-gated dielectric layer and a metal gate layer over the metal-gated dielectric layer.

8. The integrated circuit of claim 1, wherein the capacitor is a trench capacitor.

9. The integrated circuit of claim 1, wherein the capacitor is a stacked capacitor.

10. The integrated circuit of claim 1, wherein the pass transistor gate region comprises a gate stack having a gate dielectric layer and a silicon layer over the gate dielectric layer.

11. The integrated circuit of claim 10, wherein the silicon layer comprises one or more of polysilicon and amorphous silicon.

12. The integrated circuit of claim 1, wherein the pass transistor gate region comprises a gate stack having a metal-gated dielectric layer and a metal gate layer over the metal-gated dielectric layer.

13. The integrated circuit of claim 1, wherein the pass transistor comprises an n-channel metal-oxide semiconductor field effect transistor (NFET).

14. The integrated circuit of claim 1, wherein the substrate further comprises a p-type semiconductor layer below the BOX layer.

15. The integrated circuit of claim 1, wherein the pass transistor is back-gated such that a back gate electrode is present below the pass transistor, and wherein the back gate electrode serves to adjust the threshold voltage of the pass transistor.

16. The integrated circuit of claim 1, wherein the pass transistor gate region comprises a gate stack having a gate dielectric layer and a silicon layer over the gate dielectric layer, and wherein the silicon layer is doped with a p-type dopant and counter-doped with an n-type dopant so as to reduce the threshold voltage of the pass transistor.

* * * * *